United States Patent
Mazrouei et al.

(10) Patent No.: US 12,315,124 B2
(45) Date of Patent: May 27, 2025

(54) CIRCUIT DEVICE, ELECTRONIC APPARATUS, AND IMAGE PROCESSING METHOD

(71) Applicant: Seiko Epson Corporation, Tokyo (JP)

(72) Inventors: Sebdani Mahmood Mazrouei, Markham (CA); Kumar Anandabairavasamy Anand, Richmond (CA); Hideki Matsuda, Chino (JP)

(73) Assignee: SEIKO EPSON CORPORATION (JP)

( * ) Notice: Subject to any disclaimer, the term of this patent is extended or adjusted under 35 U.S.C. 154(b) by 559 days.

(21) Appl. No.: 17/667,817

(22) Filed: Feb. 9, 2022

(65) Prior Publication Data

US 2022/0270231 A1  Aug. 25, 2022

(30) Foreign Application Priority Data

Feb. 10, 2021  (JP) .................................. 2021-019425

(51) Int. Cl.
*G06T 7/00* (2017.01)
*G06T 7/11* (2017.01)
*G06T 11/60* (2006.01)

(52) U.S. Cl.
CPC .............. *G06T 7/0002* (2013.01); *G06T 7/11* (2017.01); *G06T 11/60* (2013.01); *G06T 2207/20021* (2013.01)

(58) Field of Classification Search
CPC ......... G06T 7/0002; G06T 7/11; G06T 11/60; G06T 2207/20021; H03M 13/09;

(Continued)

(56) References Cited

U.S. PATENT DOCUMENTS

| | | | |
|---|---|---|---|
| 2002/0191856 A1 | 12/2002 | Umeda et al. | |
| 2011/0032373 A1* | 2/2011 | Forutanpour | G11B 27/34 348/222.1 |

(Continued)

FOREIGN PATENT DOCUMENTS

| | | |
|---|---|---|
| JP | 2002-164869 A | 6/2002 |
| JP | 2002-374402 A | 12/2002 |

(Continued)

*Primary Examiner* — Samir A Ahmed

(74) *Attorney, Agent, or Firm* — Harness, Dickey & Pierce, P.L.C.

(57) ABSTRACT

A circuit device includes an image processing circuit that receives target image data by adding effective image data to known image data, executes image processing on the target image data, and outputs processed effective image data corresponding to a processed effective image and processed known image data corresponding to a processed known image. The processed known image data has a CRC expected value calculated in advance. A CRC calculation circuit obtains a CRC value based on the processed known image data. A determination circuit determines correctness of the image processing by comparing the CRC value with the CRC expected value of the processed known image data. The processed effective image is located in an effective image region that is displayed on a screen. The processed known image is located in a non-display region that is not displayed on the screen.

11 Claims, 8 Drawing Sheets

(58) Field of Classification Search
CPC ............ H04N 19/89; H04N 5/14; H04N 5/44; H04N 5/765; H04L 1/006; H04L 1/0061
See application file for complete search history.

(56) References Cited

U.S. PATENT DOCUMENTS

| | | | |
|---|---|---|---|
| 2013/0182553 A1 | 7/2013 | Sugibuchi et al. | |
| 2016/0232417 A1* | 8/2016 | Miyashita | H04N 5/2621 |
| 2017/0069100 A1* | 3/2017 | Chiba | B41F 33/0081 |
| 2018/0341827 A1* | 11/2018 | Niikura | H04N 23/60 |
| 2019/0013826 A1* | 1/2019 | Kikuta | H04N 19/89 |
| 2019/0132611 A1* | 5/2019 | Matsubara | H04N 19/42 |
| 2020/0050520 A1 | 2/2020 | Ogawa | |
| 2020/0410688 A1* | 12/2020 | Lv | G06T 7/75 |
| 2023/0412575 A1* | 12/2023 | Miyamoto | H04L 63/0485 |

FOREIGN PATENT DOCUMENTS

| | | |
|---|---|---|
| JP | 2013-143747 A | 7/2013 |
| JP | 2018-074274 A | 5/2018 |

\* cited by examiner

CIRCUIT DEVICE, ELECTRONIC APPARATUS, AND IMAGE PROCESSING METHOD

The present application is based on, and claims priority from JP Application Serial Number 2021-019425, filed Feb. 10, 2021, the disclosure of which is hereby incorporated by reference herein in its entirety.

BACKGROUND

1. Technical Field

The present disclosure relates to a circuit device, an electronic apparatus, and an image processing method.

2. Related Art

In terms of transmitting and receiving data, a technique for checking a communication error using a CRC is known. The CRC is an abbreviation for cyclic redundancy check. In this technique, a device that receives the data checks whether an error has occurred in received data with respect to transmission data by comparing a CRC expected value with a CRC value obtained based on the received data. Such a technique is disclosed in, for example, JP-A-2002-164869.

Data to be transmitted and received is image data, and a device that receives the data is an image processing device. In this case, a device that transmits the data transmits transmission image data and a CRC expected value of the transmission image data. The image processing device that receives the data determines correctness of received image data with respect to the transmission image data by comparing the CRC expected value with a CRC value obtained based on the received image data. Such a correctness determination is based on a premise that the device does not change the image data before and after communication, and can be used only when the premise is satisfied. However, a problem may occur where an image processing module in the image processing device may change the image data, and the correctness determination using the CRC cannot be used for data output by such an image processing module.

SUMMARY

An aspect of the present disclosure relates to a circuit device including an image processing circuit to which processing target image data obtained by adding known image data to effective image data is input, and that is configured to output, by executing image processing on the processing target image data, processed effective image data which is the effective image data subjected to the image processing and processed known image data which is the known image data subjected to the image processing, a CRC calculation circuit configured to obtain a CRC value based on the processed known image data, and a determination circuit configured to determine correctness of the image processing by comparing the CRC value with a CRC expected value of the processed known image data.

Another aspect of the present disclosure relates to a circuit device including a receiving circuit configured to receive effective image data, a known image adding circuit configured to add known image data to the effective image data to output processing target image data, first to nth image processing circuits (n is an integer of 2 or more), first to nth CRC calculation circuits, first to nth determination circuits, a known image removing circuit, and a transmission circuit. A first image processing circuit of the first to nth image processing circuits outputs, by executing first image processing on the processing target image data, first processed image data including first processed effective image data which is the effective image data subjected to the first image processing and first processed known image data which is the known image data subjected to the first image processing. An ith image processing circuit (i is an integer of 2 or more and n or less) of the first to nth image processing circuits outputs, by executing ith image processing on i-1th processed image data, ith processed image data including ith processed effective image data which is i-1th processed effective image data subjected to the ith image processing and ith processed known image data which is i-1th processed known image data subjected to the ith image processing. A kth CRC calculation circuit (k is an integer of 1 or more and n or less) of the first to nth CRC calculation circuits obtains a kth CRC value based on kth processed known image data. A kth determination circuit of the first to nth determination circuits determines correctness of kth image processing by comparing a kth CRC expected value of the kth processed known image data with the kth CRC value. The known image removing circuit extracts kth processed effective image data by removing kth processed known image data from kth processed image data. The transmission circuit transmits the kth processed effective image data extracted by the known image removing circuit.

Yet another aspect of the present disclosure relates to an electronic apparatus including the circuit device described in any of the above aspects.

Still another aspect of the present disclosure relates to an image processing method including outputting, by executing image processing on processing target image data obtained by adding known image data to effective image data, processed effective image data which is the effective image data subjected to the image processing and processed known image data which is the known image data subjected to the image processing, obtaining a CRC value based on the processed known image data, and determining correctness of the image processing by comparing the CRC value with a CRC expected value of the processed known image data.

DESCRIPTION OF EXEMPLARY EMBODIMENTS

Hereinafter, a preferred embodiment of the present disclosure will be described in detail. The present embodiment to be described below does not unduly limit contents described in the claims, and all configurations described in the present embodiment are not necessarily essential constituent elements.

1. Circuit Device

Figure 1:
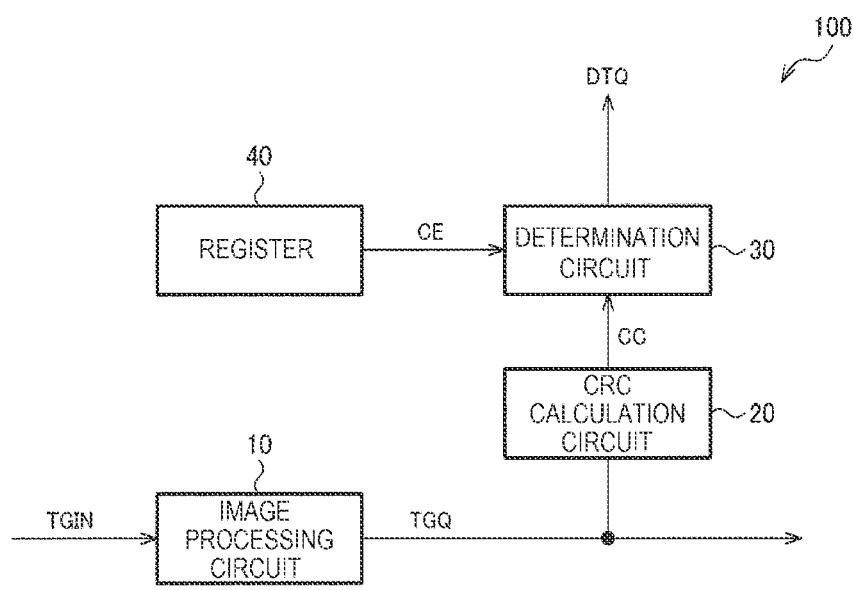
FIG. 1 is a configuration example of a circuit device.

FIG. 1 is a configuration example of a circuit device 100. The circuit device 100 includes an image processing circuit 10, a CRC calculation circuit 20, a determination circuit 30, and a register 40.

When a plurality of image processing steps are sequentially executed on image data output by a processing device or the like and then displayed on a display device, the plurality of image processing steps sequentially executed are referred to as an image processing pipeline. The circuit device 100 is one of one or more circuit devices constituting such an image processing pipeline. The circuit device 100 is, for example, an integrated circuit device in which a plurality of circuit elements are integrated on a semiconductor substrate.

Figure 2:
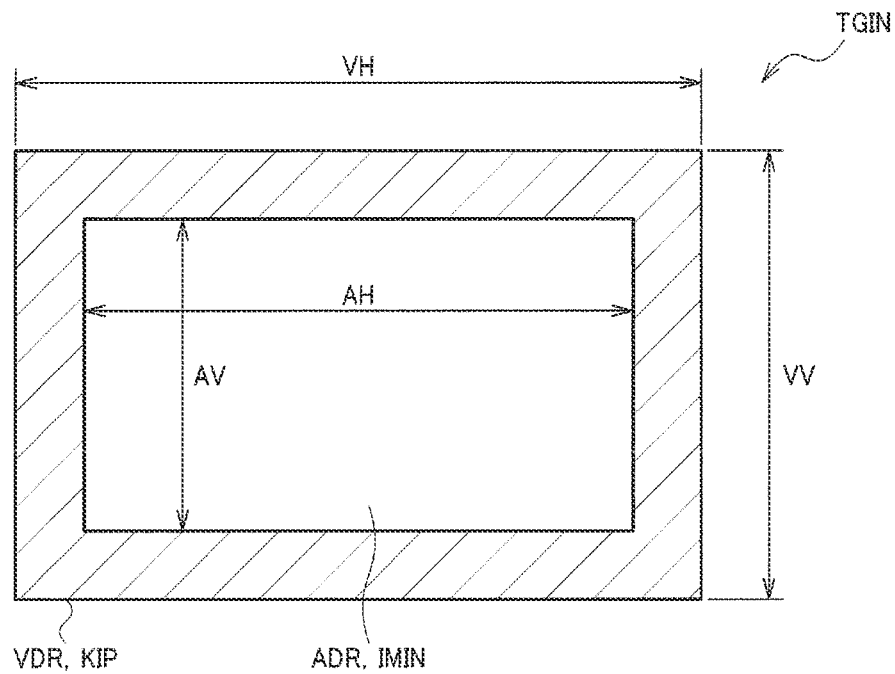
FIG. 2 is a diagram illustrating processing target image data.

Processing target image data TGIN is input to the image processing circuit 10. FIG. 2 is a diagram illustrating the processing target image data TGIN. The processing target image data TGIN is image data in which known image data KIP is added to effective image data IMIN. The effective image data IMIN is image data displayed on the display device after being processed by the image processing pipeline. The known image data KIP is image data prepared in advance in order to execute a correctness determination based on a CRC in the present embodiment, and is not displayed on the display device.

A total pixel number of one frame of the processing target image data TGIN is VH×VV, and a pixel number of the effective image data IMIN is AH×AV. In this case, a region of AH×AV is set as an effective image region ADR, and a region within a region of VH×VV and other than the effective image region ADR is set as a non-display region VDR corresponding to a blanking period. The known image data KIP is added to the non-display region VDR and is shown with hatching in FIG. 2. Although the known image data KIP is added to the entire non-display region VDR in FIG. 2, the known image data KIP may be added only to a part of the non-display region VDR.

VH is a horizontal total pixel number, and means a total pixel number in a horizontal scanning direction including the blanking period. The horizontal total pixel number is also referred to as virtual horizontal resolution. AH is a horizontal active pixel number, and is also referred to as actual horizontal resolution. VV is a vertical total line number, and means a total line number of one frame including the blanking period. The vertical total line number is also referred to as virtual vertical resolution. AV is a vertical active line number and is also referred to as actual vertical resolution. A period such as the blanking period and the pixel number can be treated equivalently by considering one pulse of a pixel clock as one pixel.

In FIG. 1, the image processing circuit 10 executes image processing for changing a content of an image with respect to the processing target image data TGIN, and outputs processed image data TGQ as a result of the image processing. Since both the effective image data IMIN and the known image data KIP are image-processed, the processed image data TGQ is image data obtained by adding processed known image data which is the image-processed known image data KIP to processed effective image data which is the image-processed effective image data IMIN. The image processing for changing the content of the image is image processing for changing pixel data constituting the image data, and does not include processing that does not change the pixel data itself such as changing a format and the like of the image data. The image processing for changing the content of the image is, for example, gamma correction processing, FRC processing, OSD processing, scaling processing, white balance processing, image synthesis processing, or a combination of two or more of these processing steps. FRC is an abbreviation for frame rate control. OSD is an abbreviation for on-screen display.

The CRC calculation circuit 20 calculates a CRC value CC based on the processed known image data of the processed image data TGQ. The CRC calculation circuit 20 obtains, for example, the CRC value CC based on the entire processed known image data that is present in the non-display region VDR. Alternatively, the CRC calculation circuit 20 may obtain the CRC value CC based on the processed known image data in a part of the non-display region VDR. In this case, the CRC calculation circuit 20 may obtain a plurality of CRC values CC based on the processed known image data in a plurality of regions in one frame. For example, the CRC calculation circuit 20 may obtain the CRC value CC for every single line based on the processed known image data of the lines.

The register 40 stores in advance a CRC expected value CE which is an expected value of the CRC value CC. What kind of image data the processed known image data becomes can be simulated in advance based on processing parameters and the like of the image processing circuit 10, and the CRC expected value CE obtained based on the processed known image data can also be calculated in advance. The CRC expected value CE prepared in this way is written, for example, from an external processing device to the register 40 in advance.

The determination circuit 30 determines correctness of the image processing in the image processing circuit 10 by comparing the CRC value CC with the CRC expected value CE. That is, when the CRC value CC and the CRC expected value CE match, the determination circuit 30 determines that the image processing is normally terminated and normal processed effective image data is obtained. When the CRC value CC and the CRC expected value CE do not match, the determination circuit 30 determines that an abnormality occurs in the image processing and normal processed effective image data is not obtained. As the abnormality of the image processing, for example, a data abnormality due to a short circuit, noise, or the like is assumed. The determination circuit 30 outputs a determination signal DTQ as a determination result.

Figure 3:
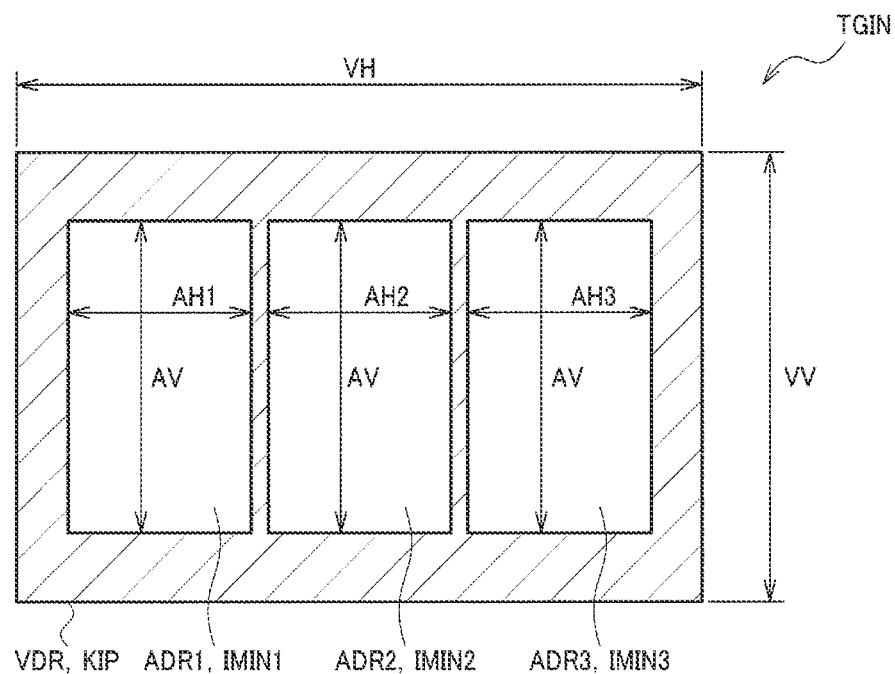
FIG. 3 is a modification of an arrangement of effective image data and known image data.

Arrangements of the effective image data IMIN and the known image data KIP in the region of VH×VV are not limited to that illustrated in FIG. 2. FIG. 3 shows an example of a modification. In FIG. 3, the effective image region is divided into three regions ADR1, ADR2, and ADR3 in the horizontal scanning direction, and the pixel number is AH1× AV, AH2×AV, and AH3×AV, respectively. AH1+AH2+ AH3=AH, for example, AH1=AH2=AH3, but AH1, AH2, and AH3 may be different from one another. The regions ADR1, ADR2, and ADR3 correspond to effective image data IMIN1, IMIN2, and IMIN3 obtained by dividing the effective image data of one frame into three. A region between the region ADR1 and the region ADR2 and a region between the region ADR2 and the region ADR3 are parts of the non-display region VDR. When the known image data is removed after the image processing pipeline, the effective image data divided into three are concatenated.

Using the arrangement as shown in FIG. 3, a temporary processing abnormality due to noise or the like is easily detected. On the other hand, any arrangement shown in FIG. 2 and FIG. 3 may be used for a non-temporary processing abnormality due to a short circuit or the like. The arrangement shown in FIG. 2 or FIG. 3 is set in advance in accordance with, for example, an assumed processing abnormality or a processing abnormality to be detected. Based on setting information, the CRC calculation circuit 20 can determine the non-display region VDR in which the processed known image data is provided in the region of VH×VV of the processed image data TGQ, and can calculate the CRC value CC based on the processed known image data of the non-display region VDR.

In the present embodiment described above, the circuit device 100 includes the image processing circuit 10, the CRC calculation circuit 20, and the determination circuit 30. In the image processing circuit 10, the processing target image data TGIN obtained by adding the known image data KIP to the effective image data IMIN is input, and the image processing circuit 10 executes image processing on the processing target image data TGIN. The image processing circuit 10 outputs the processed effective image data which is the effective image data IMIN subjected to the image processing and the processed known image data which is the known image data KIP subjected to the image processing. The CRC calculation circuit 20 obtains the CRC value CC based on the processed known image data. The determination circuit 30 determines the correctness of the image processing by comparing the CRC value CC with the CRC expected value CE of the processed known image data.

According to the present embodiment, even in the image processing for changing the content of the image, the correctness determination of the image processing can be executed using the CRC. Although various types of image processing are executed in the image processing pipeline, the CRC determination can be applied to any of the image processing circuits. Accordingly, in which image processing circuit of the image processing pipeline an abnormality has occurred can be detected. Since error detection methods can be unified to the CRC determination through the image processing pipeline, it is not necessary to develop a dedicated error detection method for the image processing, and the development of the error detection method is simplified.

Although only one image processing circuit 10 is shown in FIG. 1, another image processing circuit may be provided in a previous stage of the image processing circuit 10. In this case, the processed image data output from the image processing circuit in the previous stage is input to the image processing circuit 10 as the processing target image data. That is, the known image data input to the image processing circuit 10 may be the known image data image-processed by the image processing circuit in the previous stage. The content of the image processing in the previous stage and the content of the image processing executed by the image processing circuit 10 can be known based on every single image processing parameter. Therefore, the processed known image data output by the image processing circuit 10 can be calculated in advance using a software tool or the like to be described later, and the CRC expected value can be obtained in advance based on the processed known image data.

In the present embodiment, an image region corresponding to the processing target image data TGIN includes the effective image region ADR corresponding to the effective image data IMIN and the non-display region VDR which is a region in which the effective image data IMIN is not displayed. The known image data KIP is added to the non-display region VDR.

Since the effective image data IMIN changes according to displayed image, the CRC expected value of the processed effective image data cannot be known in advance. According to the present embodiment, by adding the known image data KIP to the non-display region VDR, the known image data KIP unrelated to the displayed image can be used for the CRC determination. That is, the CRC expected value of the processed known image data can be obtained in advance.

The image region corresponding to the processing target image data TGIN is an image region corresponding to the processing target image data TGIN for one frame, and is the region of VH×VV in FIG. 2 or FIG. 3. The non-display region VDR is a region corresponding to the blanking period as described above, and can also be referred to as a region other than the effective image region ADR in the image region corresponding to the processing target image data TGIN. The image region means a region in an xy plane when a pixel position in the horizontal scanning direction is x and a pixel position in a vertical scanning direction is y. The pixel positions x and y are managed by a pixel clock, a horizontal synchronization signal, and a vertical synchronization signal. That is, the frame is managed based on the vertical synchronization signal, the line number, that is, the pixel position y is managed based on the horizontal synchronization signal in the frame, and the pixel position x is managed based on the pulse number of the pixel clock in every single horizontal scanning period.

In the present embodiment, the non-display region VDR is the region corresponding to the blanking period.

Since the blanking period is a period in which the effective image data is not present, even if the known image data KIP is added to the non-display region VDR corresponding to the blanking period, the known image data KIP is not displayed on the display device. Using such a non-display region VDR, the CRC determination using the known image data KIP is possible.

The region corresponding to the blanking period is a region other than the effective image region ADR, and is, for example, a region corresponding to a front porch period and a back porch period as shown in FIG. 2. However, the region corresponding to the blanking period is not limited to FIG. 2, and a region among the effective image regions ADR1 to ADR3 and the like may be included in addition to the region corresponding to the front porch period and the back porch period as shown in FIG. 3.

In the present embodiment, the effective image region may be divided into first to mth effective image regions ADR1 to ADRm. m is an integer of 2 or more. The non-display region may include a region among the first to mth effective image regions ADR1 to ADRm. FIG. 3 shows an example of m=3.

According to the present embodiment, the known image data KIP is also added to the region among the first to mth effective image regions ADR1 to ADRm, and the CRC calculation circuit 20 can calculate the CRC value CC based on the known image data KIP. Accordingly, as compared with the example in FIG. 2, since the known image data KIP are arranged in a distributed manner, a temporary error due to noise or the like is easily detected.

In the present embodiment, the circuit device 100 includes the register 40. The register 40 stores the CRC expected value CE in advance.

According to the present embodiment, the register 40 can store the CRC expected value CE obtained in advance by the software tool or the like to be described later. Then, the determination circuit 30 can execute the CRC determination using the CRC expected value CE stored in advance in the register 40.

2. First Detailed Configuration Example

Figure 4:
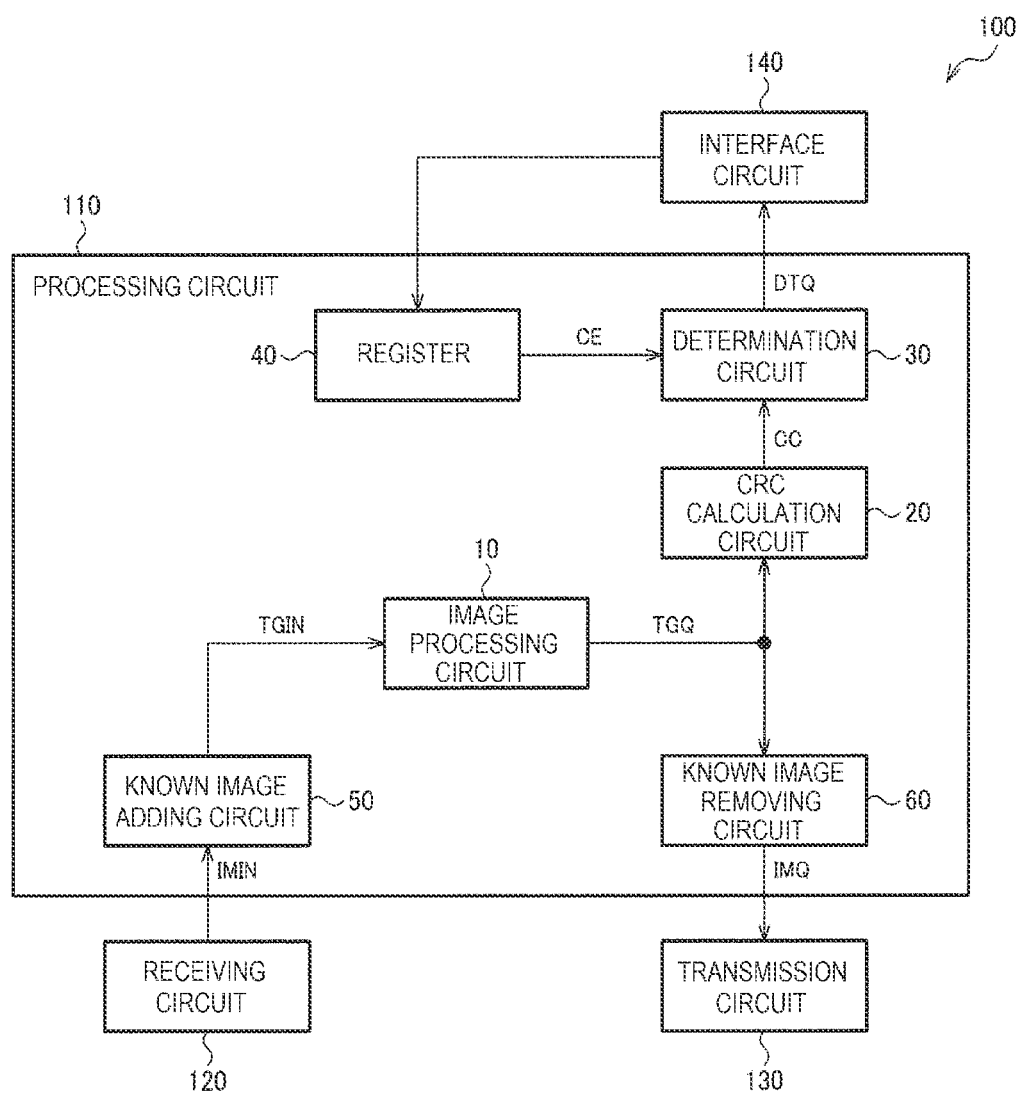
FIG. 4 is a first detailed configuration example of the circuit device.

FIG. 4 is a first detailed configuration example of the circuit device 100. The circuit device 100 includes a processing circuit 110, a receiving circuit 120, a transmission circuit 130, and an interface circuit 140. Hereinafter, parts different from those in FIG. 1 will be described, and descriptions of parts similar to those in FIG. 1 will be appropriately omitted.

The processing circuit 110 includes the image processing circuit 10, the CRC calculation circuit 20, the determination circuit 30, the register 40, a known image addition circuit 50, and a known image removing circuit 60. The processing circuit 110 is a logic circuit. For example, every single circuit provided in the processing circuit 110 may be implemented by an individual logic circuit. Alternatively, the processing circuit 110 may be a processor such as a DSP, a program or an instruction set in which a function of every single circuit is described may be stored in a memory (not shown), and the processor may execute the program and the instruction set to implement the function of every single circuit. DSP is an abbreviation for digital signal processor.

The receiving circuit 120 receives the effective image data IMIN from the external processing device of the circuit device 100. The receiving circuit 120 may be a receiving circuit of various communication interfaces, and is, for example, a receiving circuit of an LVDS, a DVI, a display port, a GMSL or a GVIF. LVDS is an abbreviation for low voltage differential signaling, DVI is an abbreviation for digital visual interface, GMSL is gigabit multimedia serial link, and GVIF is an abbreviation for gigabit video interface.

The known image adding circuit 50 generates the processing target image data TGIN by adding the known image data KIP to the effective image data IMIN. The known image data KIP is written in advance in the memory (not shown) from the external processing device or the like via the receiving circuit 120 or the interface circuit 140, and the known image adding circuit 50 adds the known image data KIP stored in the memory to the non-display region VDR. The known image adding circuit 50 may be omitted. In this case, the external processing device transmits the processing target image data TGIN to which the known image data KIP is added to the circuit device 100, and the receiving circuit 120 outputs the received processing target image data TGIN to the image processing circuit 10.

The known image removing circuit 60 extracts the processed effective image data by removing the processed known image data from the non-display region VDR of the processed image data TGQ. The known image removing circuit 60 outputs the extracted processed effective image data IMQ.

The transmission circuit 130 transmits the processed effective image data IMQ to a device in a subsequent stage of the circuit device 100. The transmission circuit 130 may be a transmission circuit of various communication interfaces, and is, for example, a transmission circuit of an LVDS, a DVI, a display port, a GMSL, or a GVIF.

The interface circuit 140 communicates between a host device of the circuit device 100 and the circuit device 100. The host device may be the same as or different from the processing device that transmits the effective image data IMIN to the circuit device 100. The interface circuit 140 receives the CRC expected value CE from the host device, and writes the CRC expected value CE to the register 40. The interface circuit 140 outputs, to the host device the determination signal DTQ determined by the determination circuit 30 using the CRC expected value CE written in the register 40. The interface circuit 140 may be an interface circuit of various communication interfaces, and is, for example, an interface circuit of I2C or SPI. I2C is an abbreviation for inter integrated circuit, and SPI is an abbreviation for serial peripheral interface.

Figure 5:
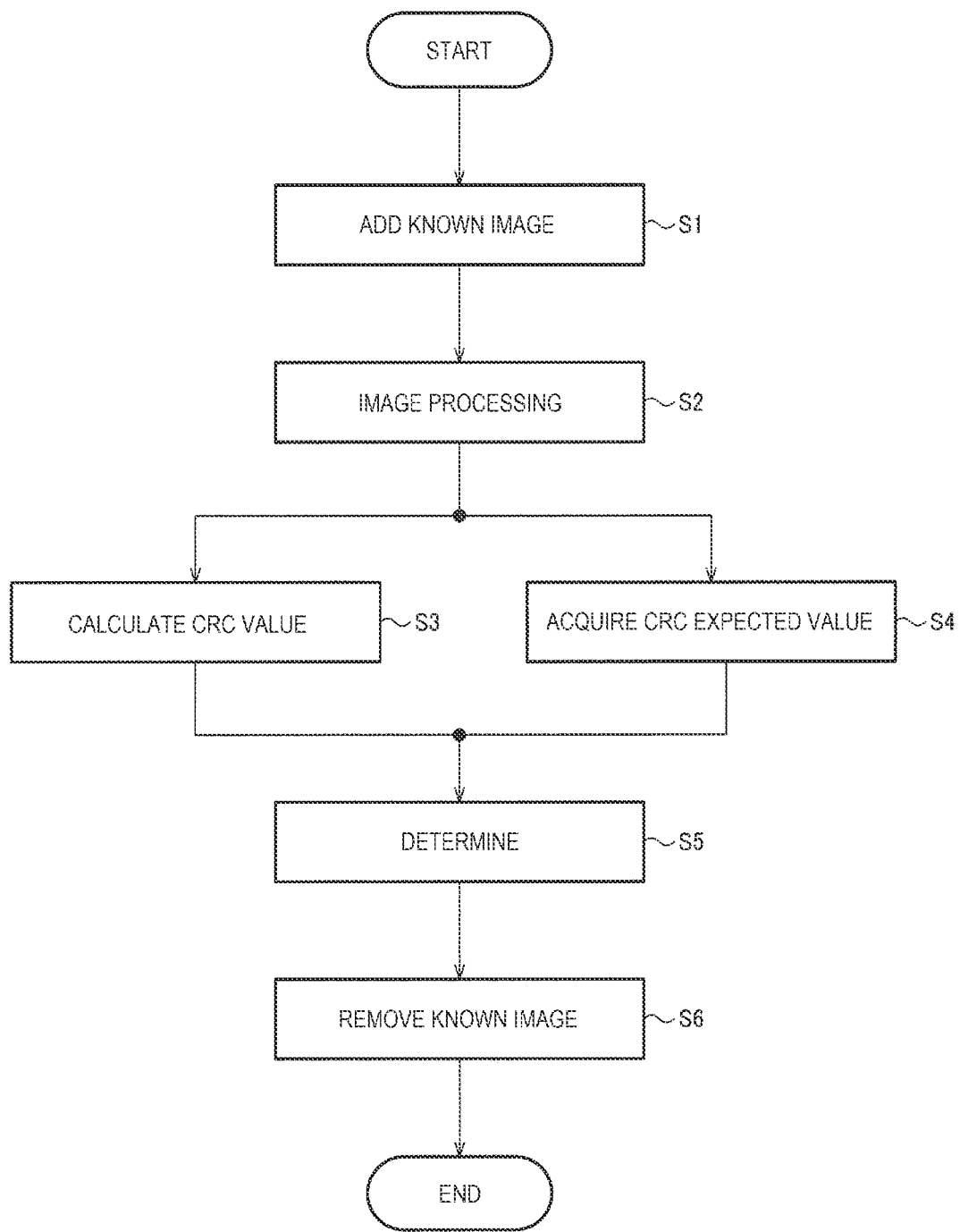
FIG. 5 is a flowchart of an image processing method.

FIG. 5 is a flowchart of an image processing method executed by the circuit device 100. The image processing method includes steps S1 to S6.

Figure 7:
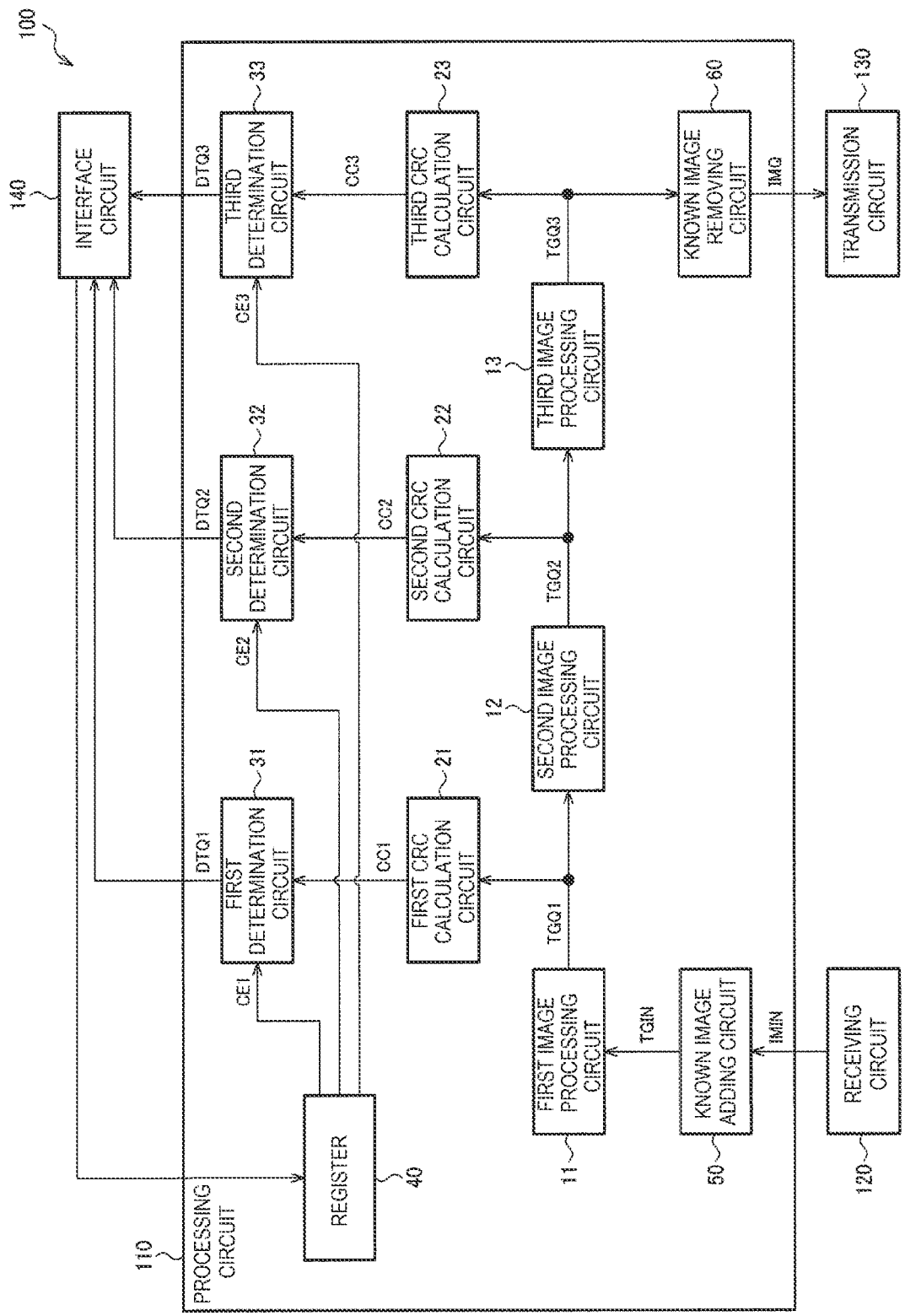
FIG. 7 is a second detailed configuration example of the circuit device.

In step S1, the known image adding circuit 50 generates the processing target image data TGIN by adding the known image data KIP to the effective image data IMIN. In step S2, the image processing circuit 10 executes the image processing on the processing target image data TGIN, and outputs the processed image data TGQ as a result of the image processing. In step S3, the CRC calculation circuit 20 calculates the CRC value CC based on the processed known image data of the processing target image data TGIN. In step S4, the determination circuit 30 acquires the CRC expected value CE from the register 40. In step S5, the determination circuit 30 determines the correctness of the image processing by comparing the CRC value CC with the CRC expected value CE. In step S6, the known image removing circuit 60 extracts the processed effective image data by removing the processed known image data from the processed image data TGQ. When the circuit device 100 includes a plurality of image processing circuits as shown in FIG. 7 to be described later, steps S2 to S5 in FIG. 5 are repeated for the number of the image processing circuits.

In the present embodiment described above, the circuit device 100 includes the known image adding circuit 50. The known image adding circuit 50 outputs the processing target image data TGIN by adding the known image data KIP to the effective image data IMIN.

According to the present embodiment, the known image adding circuit 50 adds the known image data KIP unrelated to the displayed image to the effective image data IMIN corresponding to the displayed image, so that the CRC determination using the known image data KIP is possible.

In the present embodiment, the circuit device 100 includes the known image removing circuit 60. The known image removing circuit 60 extracts the processed effective image data by removing the processed known image data from the processed image data TGQ output by the image processing circuit 10.

According to the present embodiment, by removing the known image data that is not displayed on the display device after the image processing pipeline, only the effective image data displayed on the display device can be transmitted to the device in the subsequent stage of the circuit device 100.

3. Modified Configuration Example

Figure 6:
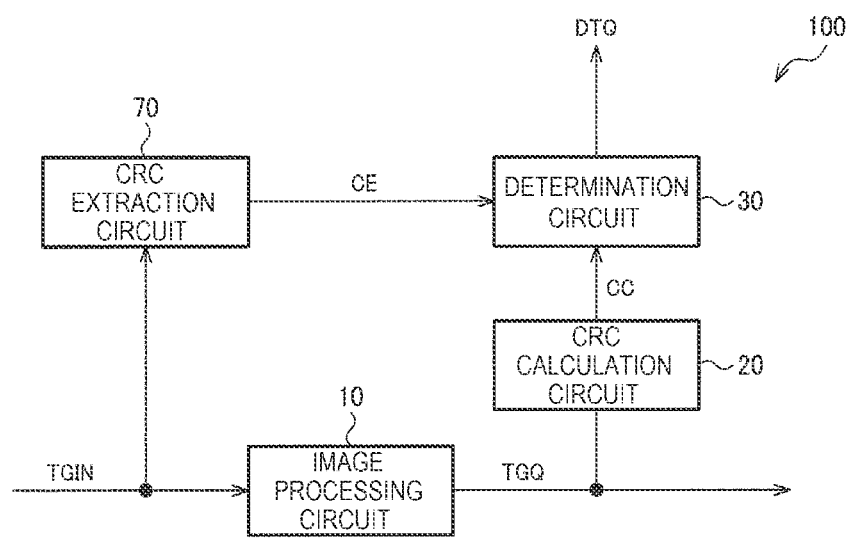
FIG. 6 is a modified configuration example of the circuit device.

FIG. 6 is a modified configuration example of the circuit device 100. In this modified configuration example, the circuit device 100 includes a CRC extraction circuit 70 instead of the register 40 in FIG. 1. This modified configuration example can be applied to any of the first detailed configuration example in FIG. 4 and a second detailed configuration example in FIG. 7 to be described later.

In FIG. 6, the CRC expected value CE is added to the non-display region VDR of the processing target image data TGIN together with the known image data KIP. When the circuit device 100 includes the known image adding circuit 50 as shown in FIG. 4, the known image adding circuit 50 adds the known image data KIP and the CRC expected value CE to the effective image data IMIN. When the external processing device transmits the processing target image data TGIN to the circuit device 100, the external processing device generates the processing target image data TGIN by adding the known image data KIP and the CRC expected value CE to the effective image data IMIN.

The CRC extraction circuit 70 extracts the CRC expected value CE from the non-display region VDR of the processing target image data TGIN, and outputs the CRC expected value CE to the determination circuit 30.

When another image processing circuit is provided in the previous stage of the image processing circuit 10, the CRC extraction circuit 70 may extract the CRC expected value CE from the processing target image data input to the image processing circuit 10, or may extract the CRC expected value CE from the processing target image data including initial known image data before any image processing. In the former case, data to be a correct CRC expected value CE at the time of input to the image processing circuit 10 is added to the non-display region VDR in consideration of the image processing in the previous stage. In the latter case, in the processing target image data including the initial known image data before any image processing, the CRC expected value CE is added to the non-display region VDR.

In the present embodiment described above, the CRC expected value CE is added to the non-display region VDR together with the known image data KIP.

According to the present embodiment, it is not necessary to store the CRC expected value CE in advance in the register 40 in FIG. 1, and the CRC extraction circuit 70 can acquire the CRC expected value CE from the processing target image data TGIN. For example, the external processing device may add the CRC expected value to the processing target image data together with the known image data and then transmit the processing target image data to the circuit device 100. In this case, the known image adding circuit 50 of the circuit device 100 is omitted.

4. Second Detailed Configuration Example

FIG. 7 is a second detailed configuration example of the circuit device 100. The circuit device 100 includes the processing circuit 110, the receiving circuit 120, the transmission circuit 130, and the interface circuit 140. Hereinafter, parts different from those in FIG. 1 or FIG. 4 will be described, and descriptions of parts similar to those in FIG. 1 or FIG. 4 will be appropriately omitted.

The processing circuit 110 includes a first image processing circuit 11, a second image processing circuit 12, a third image processing circuit 13, a first CRC calculation circuit 21, a second CRC calculation circuit 22, a third CRC calculation circuit 23, a first determination circuit 31, a second determination circuit 32, a third determination circuit 33, the register 40, the known image adding circuit 50, and the known image removing circuit 60. The processing circuit 110 may include first to nth image processing circuits, first to nth CRC calculation circuits, and first to nth determination circuits. n is an integer of 2 or more. FIG. 7 shows an example of n=3.

The register 40 stores a first CRC expected value CE1, a second CRC expected value CE2, and a third CRC expected value CE3.

The first image processing circuit 11 executes first image processing on the processing target image data TGIN and outputs first processed image data TGQ1 as a result of the first image processing. The first image processing is image processing for changing the content of the image. The first processed image data TGQ1 includes first processed effective image data which is a result of executing the first image processing on the effective image data IMIN, and first processed known image data which is a result of executing the first image processing on the known image data KIP.

The first CRC calculation circuit 21 calculates a first CRC value CC1 from the first processed known image data. The first determination circuit 31 determines correctness of the first image processing by comparing the first CRC value CC1 with the first CRC expected value CE1, and outputs a first determination signal DTQ1 as a determination result.

The second image processing circuit 12 executes second image processing on the first processed image data TGQ1, and outputs second processed image data TGQ2 as a result of the second image processing. The second image processing is image processing for changing the content of the image. The second image processing may be, for example, image processing of a different type from the first image processing, or image processing whose type is the same as the first image processing and that has different image processing parameters from the first image processing. The second processed image data TGQ2 includes second processed effective image data which is a result of executing the second image processing on the first processed effective image data, and second processed known image data which is a result of executing the second image processing on the first processed known image data. As described above, in the second detailed configuration example, the first processed known image data output by the first image processing circuit 11 in the previous stage is used as the known image data in the next second image processing circuit 12. The second image processing circuit 12 outputs the second processed known image data by executing the second image processing on the known image data.

The second CRC calculation circuit 22 calculates a second CRC value CC2 based on the second processed known image data. The second determination circuit 32 determines correctness of the second image processing by comparing the second CRC value CC2 with the second CRC expected value CE2, and outputs a second determination signal DTQ2 as a determination result.

The third image processing circuit 13 executes third image processing on the second processed image data TGQ2, and outputs third processed image data TGQ3 as a result of the third image processing. The third image processing is image processing for changing the content of the image. The third image processing may be, for example, image processing of a different type from the first image processing or the second image processing, or image processing whose type is the same as the first image processing or the second image processing and that has different image processing parameters from the first image processing or the second image processing. The third processed image data TGQ3 includes third processed effective image data which is a result of executing the third image processing on the second processed effective image data, and third processed known image data which is a result of executing the third image processing on the second processed known image data. As described above, in the second detailed configuration example, the second processed known image data output by the second image processing circuit 12 in the previous stage is used as the known image data in the next third image processing circuit 13. The third image processing circuit 13 outputs the third processed known image data by executing the third image processing on the known image data.

The third CRC calculation circuit 23 calculates a third CRC value CC3 based on the third processed known image data. The third determination circuit 33 determines correctness of the third image processing by comparing the third CRC value CC3 and the third CRC expected value CE3 and outputs a third determination signal DTQ3 as a determination result.

The interface circuit 140 transmits the first determination signal DTQ1, the second determination signal DTQ2, and the third determination signal DTQ3 to the host device.

In the present embodiment described above, the circuit device 100 includes the receiving circuit 120, the known image adding circuit 50, the first to nth image processing circuits, the first to nth CRC calculation circuits, the first to nth determination circuits, the known image removing circuit 60, and the transmission circuit 130. The receiving circuit 120 receives the effective image data IMIN. The known image adding circuit 50 outputs the processing target image data TGIN by adding the known image data KIP to the effective image data IMIN. The first image processing circuit 11 outputs the first processed image data TGQ1 by executing the first image processing on the processing target image data TGIN. The first processed image data TGQ1 includes the first processed effective image data which is the effective image data IMIN subjected to the first image processing, and the first processed known image data which is the known image data KIP subjected to the first image processing. i is an integer of 2 or more and n or less. An ith image processing circuit outputs ith processed image data TGQi by executing ith image processing on i-1th processed image data TGQi-1. The ith processed image data TGQi includes ith processed effective image data which is i-1th processed effective image data subjected to the ith image processing, and ith processed known image data which is i-1th processed known image data subjected to the ith image processing. k is an integer of 1 or more and n or less. A kth CRC calculation circuit obtains a kth CRC value CCk based on kth processed known image data. A kth determination circuit determines correctness of kth image processing by comparing a kth CRC expected value CEk of the kth processed known image data with the kth CRC value CCk. The known image removing circuit 60 extracts nth processed effective image data by removing nth processed known image data from nth processed image data TGQn. The transmission circuit 130 transmits the nth processed effective image data IMQ extracted by the known image removing circuit 60.

According to the present embodiment, the first to nth image processing circuits are provided in the image processing pipeline, and an error detection by the CRC determination is executed on every single image processing circuit on the image processing pipeline. Accordingly, in which image processing circuit of the image processing pipeline an abnormality has occurred can be detected. Since error detection methods can be unified to the CRC determination through the image processing pipeline, it is not necessary to develop a dedicated error detection method for the image processing, and the development of the error detection method is simplified.

5. Software Tool

Figure 8:
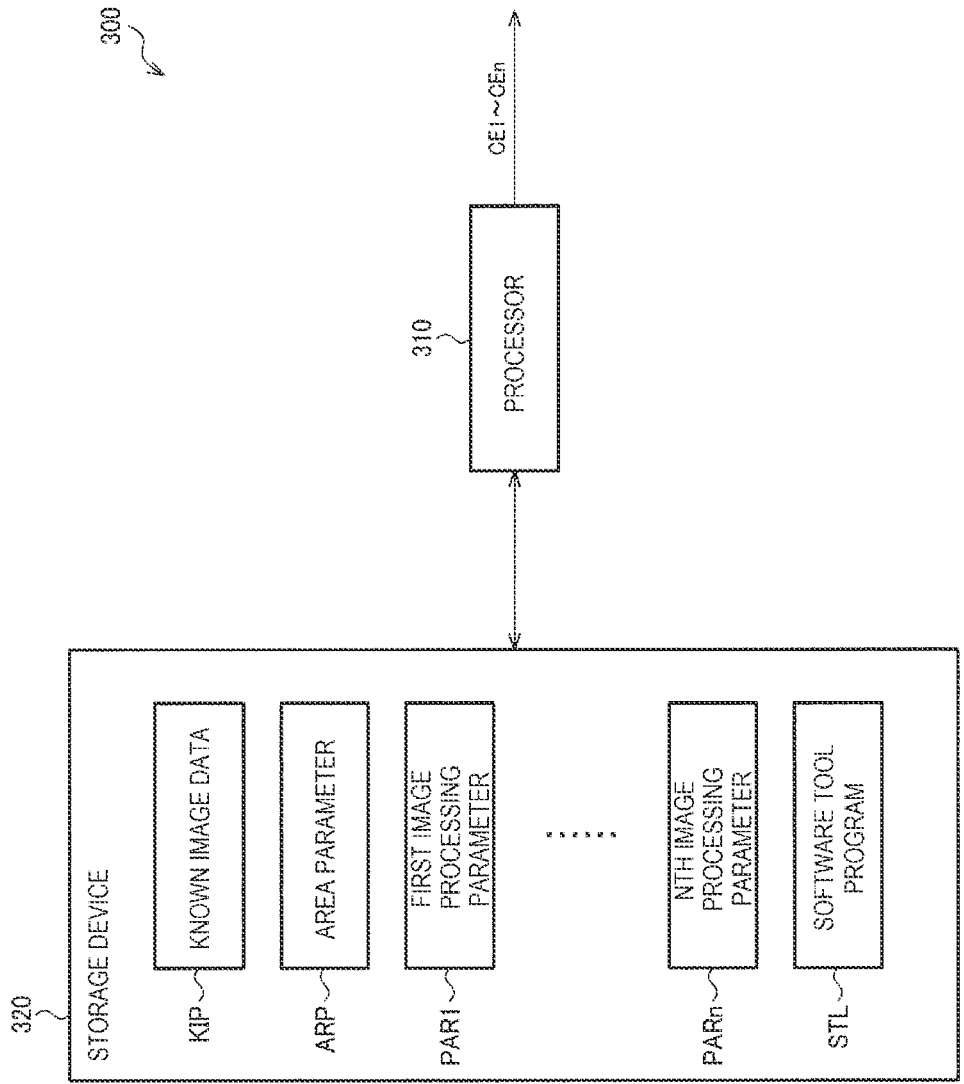
FIG. 8 is a configuration example of a processing device that executes a software tool.

FIG. 8 is a configuration example of a processing device 300 that executes a software tool for generating the CRC expected value. The processing device 300 includes a processor 310 and a storage device 320. The processing device 300 is, for example, an information processing device such as a personal computer or a portable information processing terminal such as a tablet terminal.

The storage device 320 is, for example, a semiconductor memory, a hard disk drive, or an optical disk drive. The storage device 320 stores the known image data KIP, an area parameter ARP, first to nth image processing parameters PAR1 to PARn, and a software tool program STL. The area parameter ARP shows a position of the non-display region VDR where the known image data KIP is provided. The first to nth image processing parameters PAR1 to PARn are setting parameters for setting operations or contents of the first to nth image processing. The software tool program STL is a program in which processing for generating the CRC expected value is described.

The processor 310 is a CPU, a microcomputer, a DSP, or the like. The CPU is an abbreviation for central processing unit, and the DSP is an abbreviation for digital signal processor. The processor 310 obtains first to nth CRC expected values CE1 to CEn based on the known image data KIP by executing the software tool program STL read from the storage device 320. For example, processing contents in the first to nth image processing circuits and the first to nth CRC calculation circuits are described in the software tool program STL. By executing the software tool program STL, the processor 310 executes processing similar to that executed by the first to nth image processing circuits, acquires first to nth processed known image data, executes processing similar to that executed by the first to nth CRC calculation circuits, and calculates first to nth CRC values. The processor 310 outputs the first to nth CRC values as the first to nth CRC expected values CE1 to CEn.

6. Electronic Apparatus

Figure 9:
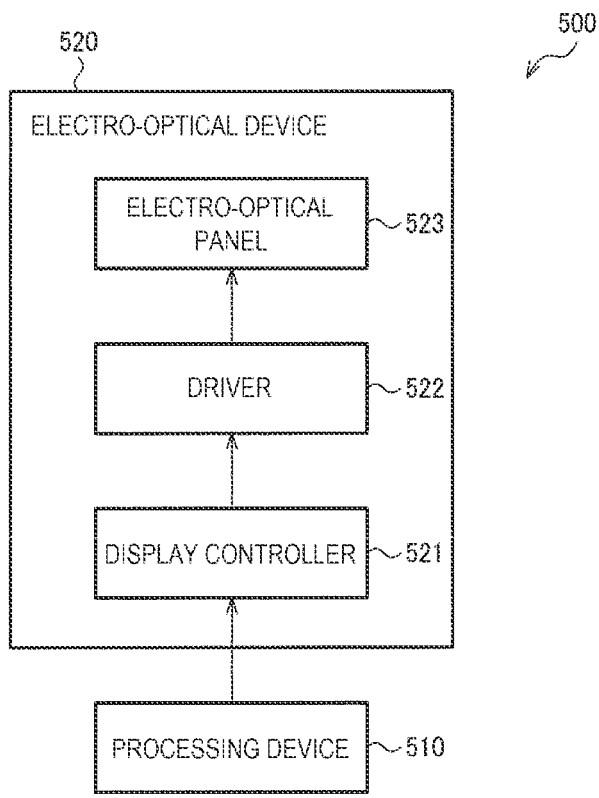
FIG. 9 is a first configuration example of an electronic apparatus.

FIG. 9 is a first configuration example of an electronic apparatus 500 to which the circuit device 100 is applied. The electronic apparatus 500 includes a processing device 510 and an electro-optical device 520.

The electro-optical device 520 is a liquid crystal display, an EL display, or the like. EL is an abbreviation for electro luminescence. The electronic apparatus 500 may be various apparatuses equipped with the displays as described above, and is, for example, a display provided in an in-vehicle cluster panel, an information processing device such as a personal computer, or a portable information processing terminal such as a tablet terminal.

The electro-optical device 520 includes a display controller 521, a driver 522, and an electro-optical panel 523. The processing device 510 is a CPU, a microcomputer, a DSP, or the like, and transmits image data of the displayed image to the display controller 521. The display controller 521 executes image processing on the image data, and outputs resulting image data of the image processing together with a display control signal to the driver 522. The display control signal is, for example, a vertical synchronization signal, a horizontal synchronization signal, and a pixel clock signal. The driver 522 drives the electro-optical panel 523 based on the received image data and the display control signal.

The circuit device 100 according to the present embodiment can be applied to, for example, the display controller 521 in FIG. 9.

Figure 10:
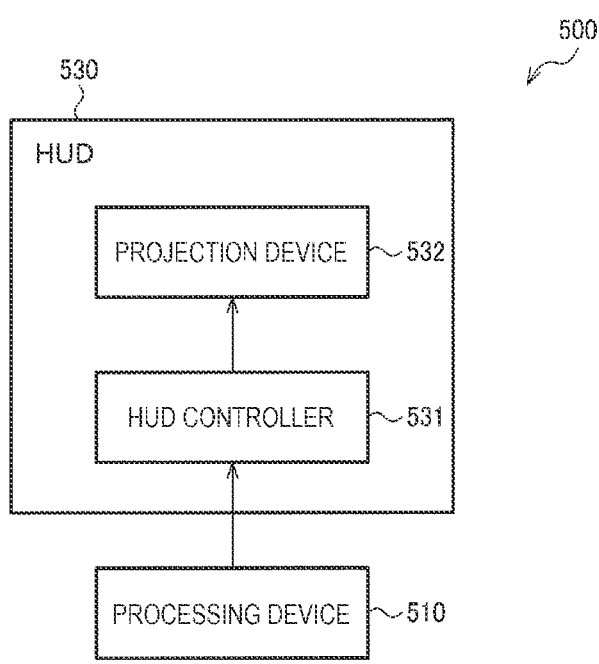
FIG. 10 is a second configuration example of the electronic apparatus.

FIG. 10 is a second configuration example of the electronic apparatus 500 to which the circuit device 100 is applied. The electronic apparatus 500 includes the processing device 510 and a HUD 530. HUD is an abbreviation for head up display.

The HUD 530 includes a HUD controller 531 and a projection device 532. The processing device 510 transmits the image data of the displayed image to the HUD controller 531. The HUD controller 531 executes image processing on the image data, and outputs resulting image data of the image processing together with a display control signal to the projection device 532. The projection device 532 includes, for example, a driver, a liquid crystal display panel, a light source, and an optical device. The driver causes the liquid crystal display panel to display the image based on the image data and the display control signal that are received from the HUD controller 531. The light source emits projection light to the liquid crystal display panel, and projection light transmitted through the liquid crystal display panel enters the optical device. The optical device projects the projection light transmitted through the liquid crystal display panel onto a screen. The screen is, for example, a windshield of a moving body, and a dedicated screen may be provided. The moving body is an automobile, an airplane, a ship, or the like.

The circuit device 100 according to the present embodiment can be applied to, for example, the HUD controller 531 in FIG. 10.

The circuit device according to the present embodiment described above includes an image processing circuit, a CRC calculation circuit, and a determination circuit. In the image processing circuit, processing target image data obtained by adding known image data to effective image data is input, and the image processing circuit outputs, by executing image processing on the processing target image data, processed effective image data which is the effective image data subjected to the image processing and processed known image data which is the known image data subjected to the image processing. The CRC calculation circuit obtains a CRC value based on the processed known image data. The determination circuit determines correctness of the image processing by comparing the CRC value with a CRC expected value of the processed known image data.

According to the present embodiment, even in the image processing for changing the content of the image, the correctness determination of the image processing can be executed using the CRC. Although various types of image processing are executed in the image processing pipeline, the CRC determination can be applied to any of the image processing circuits. Accordingly, in which image processing circuit of the image processing pipeline an abnormality has occurred can be detected. Since error detection methods can be unified to the CRC determination through the image processing pipeline, it is not necessary to develop a dedicated error detection method for the image processing, and the development of the error detection method is simplified.

In the present embodiment, an image region corresponding to the processing target image data may include an effective image region corresponding to the effective image data and a non-display region. The non-display region is a region in which the effective image data is not displayed. The known image data may be added to the non-display region.

According to the present embodiment, by adding the known image data to the non-display region, the known image data unrelated to the displayed image can be used for the CRC determination. That is, the CRC expected value of the processed known image data can be obtained in advance.

In the present embodiment, the non-display region may be a region corresponding to a blanking period.

Since the blanking period is a period in which the effective image data is not present, even if the known image data is added to the non-display region corresponding to the blanking period, the known image data is not displayed on the display device. Using such a non-display region, the CRC determination using the known image data is possible.

In the present embodiment, the effective image region may be divided into first to mth effective image regions. m is an integer of 2 or more. The non-display region may include a region between the first to mth effective image regions.

According to the present embodiment, the known image data is also added to the region among the first to mth effective image regions, and the CRC calculation circuit can calculate the CRC value based on the known image data. Accordingly, as compared the case in which the effective image region is not divided, since the known image data are arranged in a distributed manner, a temporary error due to noise or the like is easily detected.

The circuit device according to the present embodiment may include a register that stores the CRC expected value in advance.

According to the present embodiment, the register can store the CRC expected value obtained in advance by the software tool or the like to be described later. Then, the determination circuit can execute the CRC determination using the CRC expected value stored in advance in the register.

In the present embodiment, the CRC expected value may be added to the non-display region together with the known image data.

According to the present embodiment, it is not necessary to store the CRC expected value in the register in advance, and the CRC expected value can be acquired based on the processing target image data.

The circuit device according to the present embodiment may include a known image adding circuit. The known image adding circuit may output the processing target image data by adding the known image data to the effective image data.

According to the present embodiment, the known image adding circuit adds the known image data unrelated to the displayed image to the effective image data corresponding to the displayed image, so that the CRC determination using the known image data is possible.

The circuit device according to the present embodiment may include a known image removing circuit. The known image removing circuit may extract the processed effective image data by removing the processed known image data from the processed image data output by the image processing circuit.

According to the present embodiment, by removing the known image data that is not displayed on the display device after the image processing pipeline, only the effective image data displayed on the display device can be transmitted to the device in the subsequent stage of the circuit device.

The circuit device according to the present embodiment may include a first image processing circuit which is the above-described image processing circuit and a second image processing circuit. The processing target image data may be input to the first image processing circuit, and the first image processing circuit may output, by executing first image processing which is the image processing on the processing target image data, first processed image data including first processed effective image data which is the processed effective image data and first processed known image data which is the processed known image data. The second image processing circuit may output, by executing second image processing on the first processed image data, second processed image data including second processed effective image data which is the first processed effective image data subjected to the second image processing and second processed known image data which is the first processed known image data subjected to the second image processing.

The circuit device according to the present embodiment may include a first CRC calculation circuit which is the above-described CRC calculation circuit, a first determination circuit which is the above-described determination circuit, a second CRC calculation circuit, and a second determination circuit. The first CRC calculation circuit may calculate a first CRC value which is the above-described CRC value. The first determination circuit may determine correctness of the first image processing by comparing the first CRC value with a first CRC expected value which is the above-described CRC expected value. The second CRC calculation circuit may obtain a second CRC value based on the second processed known image data. The second determination circuit may determine correctness of the second image processing by comparing the second CRC value with a second CRC expected value of the second processed known image data.

The circuit device according to the present embodiment may include a receiving circuit that receives effective image data, a known image adding circuit, first to nth image processing circuits, first to nth CRC calculation circuits, first to nth determination circuits, a known image removing circuit, and a transmission circuit. n is an integer of 2 or more. The known image adding circuit may output processing target image data by adding known image data to the effective image data. A first image processing circuit of the first to nth image processing circuits may output, by executing first image processing on the processing target image data, first processed image data including first processed effective image data which is the effective image data subjected to the first image processing and first processed known image data which is the known image data subjected to the first image processing. An ith image processing circuit of the first to nth image processing circuits may output, by executing ith image processing on i-1th processed image data, ith processed image data including ith processed effective image data which is i-1th processed effective image data subjected to the ith image processing and ith processed known image data which is i-1th processed known image data subjected to the ith image processing. i is an integer of 2 or more and n or less. A kth CRC calculation circuit of the first to nth CRC calculation circuits may obtain a kth CRC value based on kth processed known image data. k is an integer of 1 or more and n or less. A kth determination circuit of the first to nth determination circuits may determine correctness of kth image processing by comparing a kth CRC expected value of the kth processed known image data with the kth CRC value. The known image removing circuit may extract nth processed effective image data by removing nth processed known image data from nth processed image data. The transmission circuit may transmit the nth processed effective image data extracted by the known image removing circuit.

According to the present embodiment, a plurality of image processing circuits are provided in the image processing pipeline, and an error detection by the CRC determination is executed on every single image processing circuit on the image processing pipeline. Accordingly, in which image processing circuit of the image processing pipeline an abnormality has occurred can be detected. Since error detection methods can be unified to the CRC determination through the image processing pipeline, it is not necessary to develop a dedicated error detection method for the image processing, and the development of the error detection method is simplified.

The electronic apparatus according to the present embodiment includes the circuit device described in any of the above embodiments.

The image processing method according to the present embodiment includes outputting, by executing image processing on processing target image data obtained by adding known image data to effective image data, processed effective image data which is the effective image data subjected to the image processing and processed known image data which is the known image data subjected to the image processing. The image processing method includes obtaining a CRC value based on the processed known image data. The image processing method includes determining correctness of the image processing by comparing the CRC value with a CRC expected value of the processed known image data.

Although the present embodiment has been described in detail above, it will be easily understood by those skilled in the art that many modifications can be made without substantially departing from the novel matters and effects of the present disclosure. Therefore, all such modifications are intended to be included within the scope of the present disclosure. For example, a term cited with a different term having a broader meaning or the same meaning at least once in the description or in the drawings can be replaced with the different term in any place in the description or in the drawings. All combinations of the present embodiment and the modifications are also included in the scope of the present disclosure. The configuration, operation, and the like of the circuit device, the electronic apparatus, or the like, or the processing procedure of the image processing method and the like are not limited to those described in the present embodiment, and various modifications can be made.

What is claimed is:

1. A circuit device comprising:
 a register configured to store a cyclic redundancy check (CRC) expected value of a known image data of a known image in advance, the CRC expected value being obtained by performing image processing on the known image data in advance;
 an image processing circuit configured to:
 receive target image data, the target image data being formed by adding:
 effective image data corresponding to an effective image;
 to the known image data corresponding to the known image; and
 execute the image processing on the target image data so as to output:
 processed effective image data subjected to the image processing, the processed effective image data corresponding to a processed effective image; and
 processed known image data subjected to the image processing, the processed known image data corresponding to a processed known image, the processed known image data having the CRC expected;
 a CRC calculation circuit configured to obtain a CRC value based on the processed known image data; and a determination circuit configured to determine correctness of the image processing by comparing the CRC value of the processed known image data with the CRC expected value, wherein the processed effective image is located in an effective image region that is displayed on a screen, and the processed known image is located in a non-display region that is not displayed on the screen.

2. The circuit device according to claim 1, wherein the non-display region is a region corresponding to a blanking period.

3. The circuit device according to claim 1, wherein the effective image region is divided into first to mth effective image regions, wherein m is an integer of 2 or more, and the non-display region includes an adjacent region between two effective image regions of the first to mth effective image regions.

4. The circuit device according to claim 1, further comprising: a register configured to store the CRC expected value in advance.

5. The circuit device according to claim 1, wherein the CRC expected value is added to the non-display region together with the known image data.

6. The circuit device according to claim 1, wherein the image processing circuit is further configured to:

execute the image processing on the target image data to generate processed target image data; and extract the processed effective image data by removing the processed known image data from the processed target image data.

7. The circuit device according to claim 1, further comprising:

another image processing circuit, wherein the image processing circuit is configured to execute the image processing on the target image data to generate first processed target image data, and the first processed target image data includes the processed effective image data and the processed known image data, and the another image processing circuit is configured to execute another image processing on the first processed target image data to output another processed effective image data and another processed known image data.

8. The circuit device according to claim 7, further comprising:

another CRC calculation circuit configured to obtain another CRC value based on the another processed known image data; and another determination circuit configured to determine correctness of the another image processing by comparing the another CRC value with another CRC expected value of the another processed known image data.

9. A circuit device comprising:

a register configured to store a cyclic redundancy check (CRC) expected value of a known image data of a known image in advance, the CRC expected value being obtained by performing image processing on the known image data in advance;

a receiving circuit configured to receive effective image data;

a known image adding circuit configured to add the known image data to the effective image data to output processed target image data;

first to nth image processing circuits, wherein n is an integer of 2 or more;

first to nth CRC calculation circuits;

first to nth determination circuits;

a known image removing circuit; and a transmission circuit, wherein the first image processing circuit of the first to nth image processing circuits is configured to execute first image processing on the processed target image data to output first processed image data including first processed effective image data which is the effective image data subjected to the first image processing and first processed known image data which is the known image data subjected to the first image processing, an ith image processing circuit, wherein i is an integer of 2 or more and n or less of the first to nth image processing circuits is configured to execute ith image processing on i-1th processed image data to output ith processed image data including ith processed effective image data which is i-1th processed effective image data subjected to the ith image processing and ith processed known image data which is i-1th processed known image data subjected to the ith image processing, a kth CRC calculation circuit, wherein k is an integer of 1 or more and n or less of the first to nth CRC calculation circuits is configured to obtain a kth CRC value based on kth processed known image data, a kth determination circuit of the first to nth determination circuits is configured to determine correctness of kth image processing by comparing a kth CRC expected value with the kth CRC value of the kth processed known image data, the known image removing circuit is configured to extract nth processed effective image data by removing nth processed known image data from nth processed image data, the nth processed known image data corresponds to nth processed known image, and the nth processed effective image data corresponds to nth processed effective image, the transmission circuit is configured to transmit the nth processed effective image data, the nth processed effective image is located in an effective image region that is displayed on a screen, and the nth processed known image is located in a non-display region that is not displayed on the screen.

10. An electronic apparatus comprising the circuit device according to claim 1.

11. An image processing method, comprising:

storing a cyclic redundancy check (CRC) expected value of a known image data of a known image in advance, the CRC expected value being obtained by performing image processing on the known image data in advance;

receiving target image data, the target image data being formed by adding:

effective image data corresponding to an effective image;

to the known image data corresponding to the known image; and executing the image processing on the target image data so as to output:

processed effective image data subjected to the image processing, the processed effective image data corresponding to a processed effective image; and processed known image data subjected to the image processing, the processed known image data corresponding to a processed known image, the processed known image data having the CRC expected value;

obtaining a CRC value based on the processed known image data; and determining correctness of the image processing by comparing the CRC value of the processed known image data with the CRC expected value, wherein the processed effective image is located in an effective image region that is displayed on a screen, and the processed known image is located in a non-display region that is not displayed on the screen.

* * * * *